(12) United States Patent
Thürlemann

(10) Patent No.: US 6,460,751 B1
(45) Date of Patent: Oct. 8, 2002

(54) BONDHEAD FOR A WIRE BONDER

(75) Inventor: Silvan Thürlemann, Unterägeri (CH)

(73) Assignee: ESEC Trading SA, Cham (CH)

( * ) Notice: Subject to any disclaimer, the term of this patent is extended or adjusted under 35 U.S.C. 154(b) by 0 days.

(21) Appl. No.: 09/695,616

(22) Filed: Oct. 24, 2000

(30) Foreign Application Priority Data

Nov. 2, 1999 (CH) .............................. 2008/99

(51) Int. Cl.⁷ .............................................. B23K 37/00
(52) U.S. Cl. ..................................... 228/4.5; 228/180.5
(58) Field of Search ........................ 228/1.1, 4.1, 4.5, 228/180.5

(56) References Cited

U.S. PATENT DOCUMENTS

| | | | |
|---|---|---|---|
| 4,598,853 A | * 7/1986 | Hill | 228/4.5 |
| 4,619,395 A | * 10/1986 | Amorosi et al. | 228/4.5 |
| 4,700,877 A | * 10/1987 | Dodds et al. | 228/2 |
| 4,903,883 A | * 2/1990 | Thurlemann et al. | 228/1.1 |
| 5,114,302 A | 5/1992 | Meisser et al. | |
| 5,170,928 A | * 12/1992 | Farassat | 228/4.5 |
| 5,330,089 A | 7/1994 | Orcutt et al. | |
| 5,871,136 A | * 2/1999 | Miller | 228/4.5 |
| 5,971,254 A | * 10/1999 | Naud et al. | 228/180.5 |
| 6,196,445 B1 | * 3/2001 | Fogal et al. | 228/180.5 |

FOREIGN PATENT DOCUMENTS

EP 0 541 116 5/1993

* cited by examiner

Primary Examiner—M. Alexandra Elve
Assistant Examiner—Zidia Pittman
(74) Attorney, Agent, or Firm—McCormick, Paulding & Huber LLP

(57) ABSTRACT

A Wire Bonder contains a bondhead which comprises a slide, a rotary beam rotatable on a vertical axis and a rocker mounted on the rotary beam. The slide is movable back and forth in a predetermined horizontal direction and moves the rotary beam with it. The slide preferably bears on a horizontally arranged glide plate by means of an air bearing charged with vacuum. The rotary beam also preferably bears on the glide plate by means of a further air bearing charged with vacuum. A drive arranged on the slide is preferably foreseen for the rotating movement of the rotary beam.

22 Claims, 3 Drawing Sheets

BONDHEAD FOR A WIRE BONDER

BACKGROUND OF THE INVENTION

Figure 1:
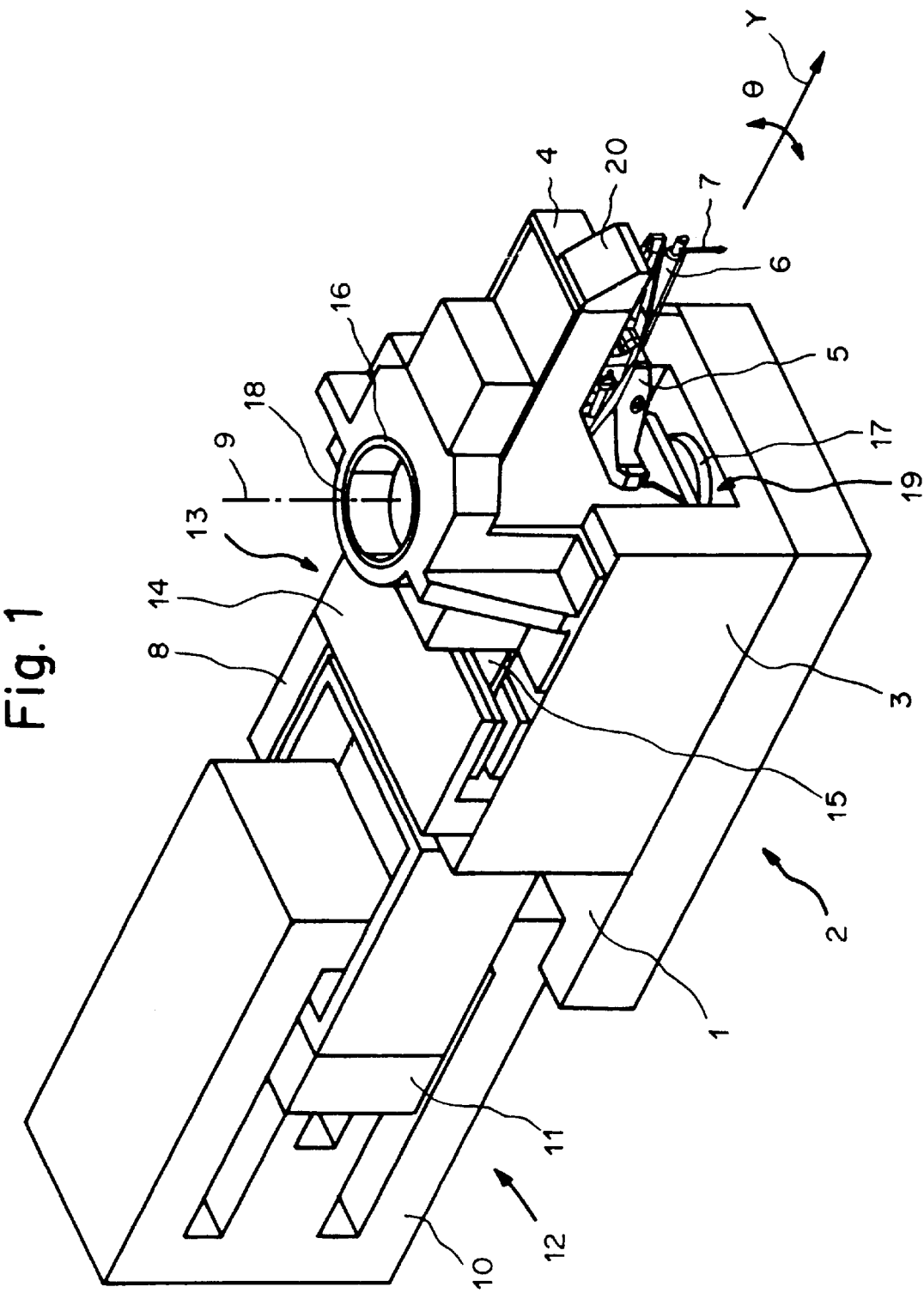

The invention concerns a bondhead for a Wire Bonder.

Wire Bonders are used for the production of wire connections between a semiconductor chip and a substrate. Most of the Wire Bonders available on the market today move the bondhead in the horizontal xy plane by means of two orthogonally arranged drives. An example of such a drive system is revealed in the patent specification EP 317 787. This drive system also uses air bearings charged by means of vacuum. A considerable disadvantage of this well-known Wire Bonder exists in that when moving the bondhead to a new position relatively large masses must be accelerated. This requires powerful drive systems and robust bearings. A further disadvantage exists in that, depending on the position of the bondhead, on accelerating the bondhead relatively large torques occur which place great demands on the bondhead bearings. This sets limits on the maximum possible acceleration values and therefore the production rate of the Wire Bonder.

A Wire Bonder is known from the patent specification U.S. Pat. No. 5,330,089 with which movement of the bondhead takes place with a polar drive system. With this drive system relatively large masses must also be accelerated. The load to be accelerated by the motor on rotation is additionally dependent on the position of the load in relation to the linear axis which, on the one hand, hampers control of the bondhead movements and, on the other hand, sets limits on the maximum possible acceleration values.

The object of the invention is to develop a new Wire Bonder whose bondhead withstands considerably higher accelerations.

BRIEF DESCRIPTION OF THE INVENTION

A Wire Bonder according to the invention contains a bondhead which comprises a slide, a rotary beam rotatable on a vertical axis and a rocker mounted on the rotary beam. The slide is movable back and forth in a predetermined horizontal direction and moves the rotary beam with it. The slide preferably bears on a horizontally arranged glide plate by means of an air bearing charged with vacuum. The rotary beam also preferably bears on the glide plate by means of a further air bearing charged with vacuum. A drive arranged on the slide is preferably foreseen for the rotating movement of the rotary beam.

In the following, embodiments of the invention are explained in more detail.

BRIEF DESCRIPTION OF THE DRAWING FIGURES

Figure 2:
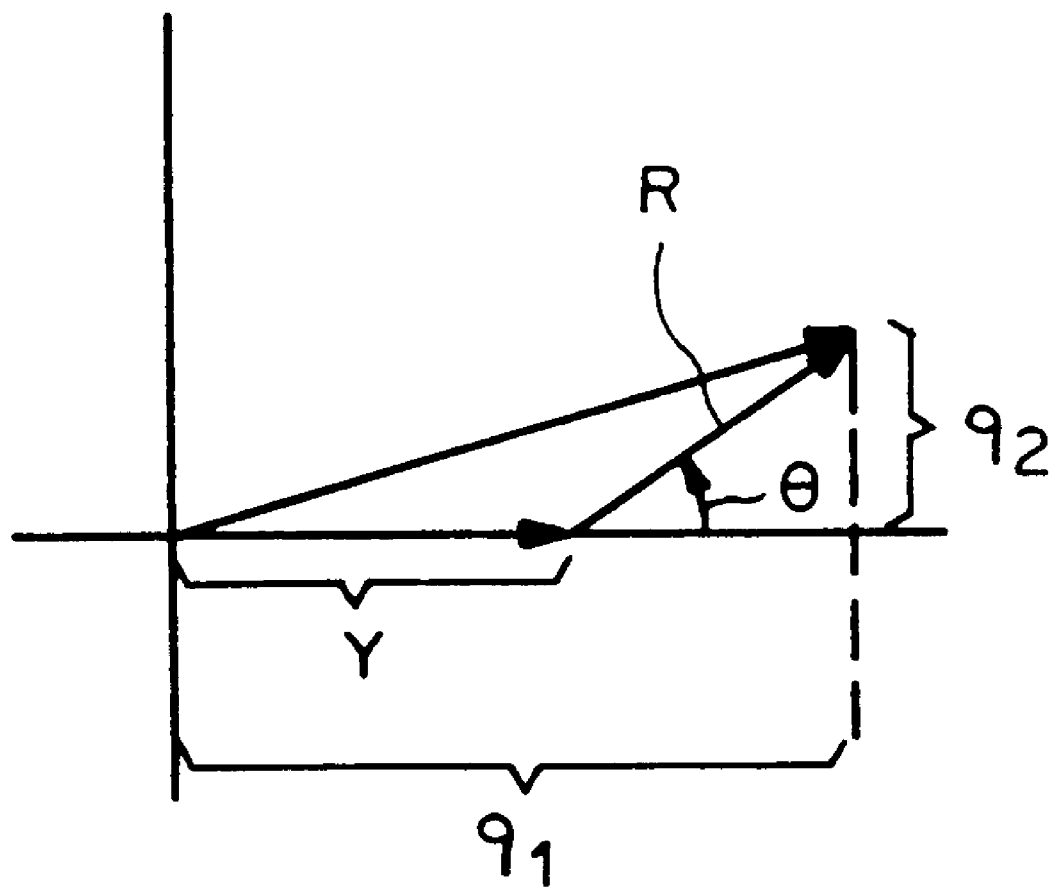

It is shown in:

FIG. 1 a perspective view of a Wire Bonder,

FIG. 2 a coordinate diagram, and

Figure 3:
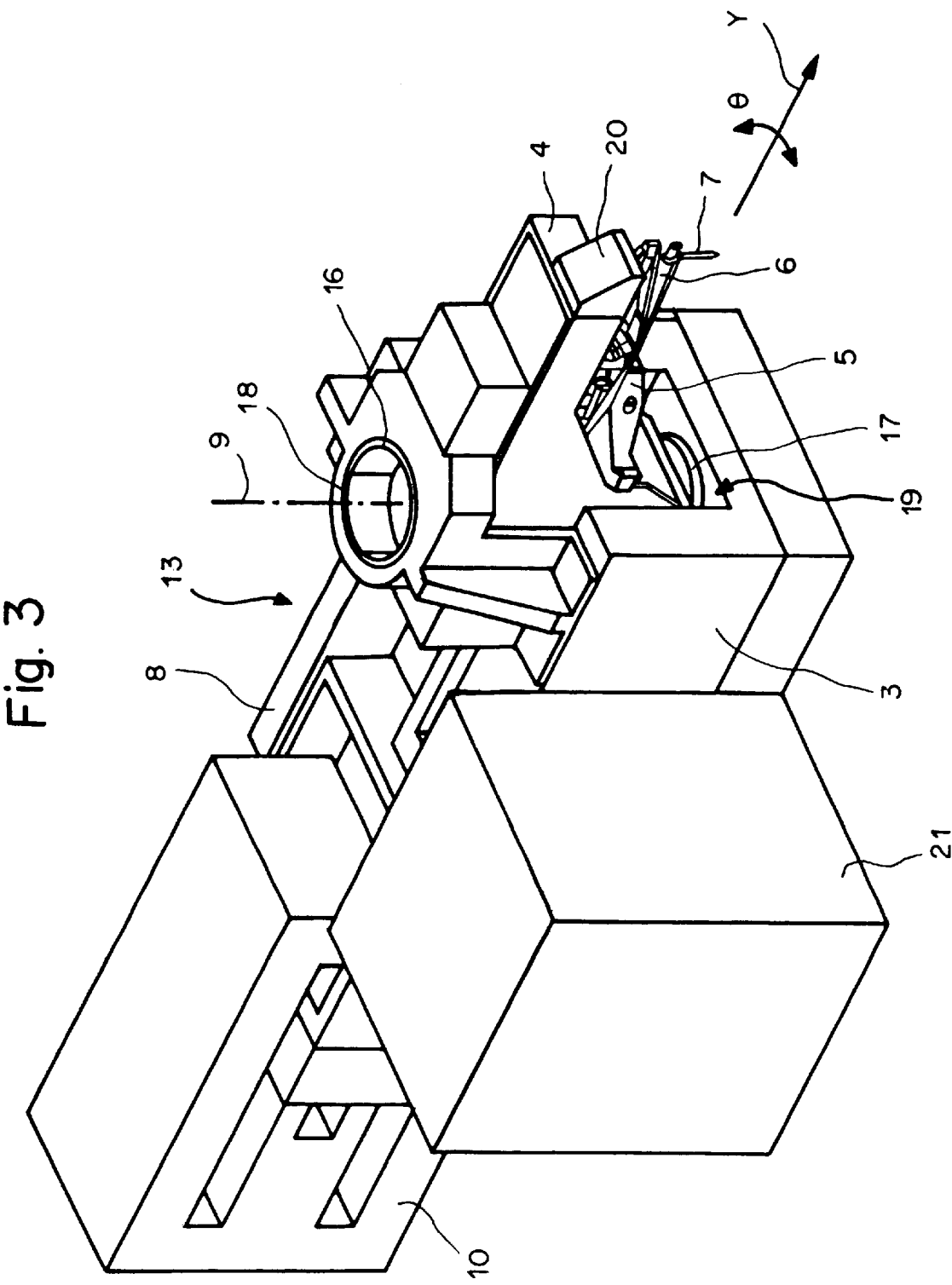

FIG. 3 a perspective view of a further Wire Bonder.

DETAILED DESCRIPTION OF THE INVENTION

FIG. 1 shows a Wire Bonder for the production of wire connections with a horizontally arranged glide plate 1 and a bondhead 2 sliding on the glide plate 1. The bondhead 2 comprises a slide 3, a rotary beam 4 and a rocker 5. Attached to the rocker 5 is a horn 6 to which ultrasonics can be applied at the tip of which a capillary 7 is clamped which guides the wire. The slide 3 runs on the glide plate 1 by means of a first air bearing charged with vacuum and along a rigidly arranged bearing element 8 which is arranged parallel to a direction designated as y direction by means of a second air bearing charged with vacuum. Charging the two air bearings with vacuum has the effect that the slide 3 not only runs on bearings but is also pulled against the glide plate 1 or the bearing element 8 with a predetermined force: Movement of the slide 3 is only possible in y-direction only and takes place practically without friction.

The slide 3 moves the rotary beam 4 back and forth in y-direction. The rotary beam 4 is rotatable on a vertical axis 9 which moves with the slide 3 in y-direction and bears on the slide 3, whereby the bearing is preferably designed as an air bearing: Because the air cushion automatically equalizes unavoidable local deviations from the ideal shape of the area bordered by the air bearing, the position of the axis 9 is very stable in relation to the slide 3. The rotary beam 4 is rotatable by an angle θ of approximately ±15° in relation to the y-direction.

The rotary beam 4 bears preferably directly on the glide plate 1 by means of a third air bearing charged with vacuum so that only the slide 3 takes over guidance of the rotary beam 4 in y direction and not the vertical bearing of the rotary beam 4. Any vertical oscillations of the slide 3 are therefore not transmitted to the capillary 7.

The rocker 5, rotatable on a horizontal axis, is mounted on the rotary beam 4. The slide 3 and the rotary beam 4 enable movement of the capillary 7 in a predetermined area within the horizontal plane. The rocker 5 enables movement of the capillary 7 in vertical direction.

A linear motor 12, formed from a rigidly arranged stator 10 and a movable coil 11, serves as the drive for the slide 3. The rotating movement of the rotary beam 4 around the vertical axis 9 takes place by means of a second linear motor 13, the stator 14 of which is secured to the slide 3 and its coil 15 is secured to the rotary beam 4. Because the linear motor 13 is secured to the slide 3 with which it moves, the coil 15 can easily be arranged opposite the capillary 7 in relation to the vertical axis 9 so that the rotary beam 4 is counterbalanced in relation to the vertical axis 9 by means of the elements which it carries with it. Advantageously, the distance from the coil 15 to the vertical axis 9 is selected and the corresponding stator 14 so arranged that the centre of gravity of the rotary beam 4 and the elements which it carries lies on the vertical axis 9 or as close as possible to the vertical axis 9. On rotation of the rotary beam 4 the load on the bearing therefore remains low.

For the horizontal bearing of the rotary beam 4 in the slide 3, two air bearings separated in vertical direction are foreseen which are arranged at the top and bottom of the slide 3. The use of only one air bearing as well as the use of two air bearings which are separated by a predetermined distance contribute to the stability of the position of the vertical axis in relation to the slide 3. For the formation of the two spatially separated air bearings, the rotary beam 4 has two cylinders 16 and 17 which engage in drill holes 18 and 19 of the slide 3. The two cylinders 16 and 17 demonstrate two rows with drill holes through which the air supplied to the inside of the cylinders 16 and 17 flows outwards against the edge of the drill hole 18 or 19 and guarantees the practically frictionless and free of play bearing of the rotary beam 4 on the slide 3.

The third air bearing charged with vacuum, which serves the vertical bearing of the rotary beam 4, is preferably directly integrated into the lower cylinder 17. The areas available for charging with vacuum and therefore the maximum possible tensile force in the cylinder 17 on the rotary beam 4 in vertical direction increases square to the diameter of the lower cylinder 17. The rigidity of the rotary beam 4 can therefore be influenced by the selection of this diameter. If required, the rigidity of the rotary beam 4 can also be increased in that, above the rotary beam 4, a second glide plate is arranged parallel to glide plate 1 whereby the rotary beam 4 then bears on air bearings between the glide plates.

The picture of the bond area is projected to a camera (not presented) secured to the slide 3 and centred on the vertical axis 9 via two deflection mirrors secured to the rotary beam 4. One of the deflection mirrors 20 is arranged above the tip of the horn 6 and the other (not visible) is arranged centred in relation to the vertical axis 9. The rotary beam 4 and all elements which are arranged on the rotary beam 4, eg, rocker 5, coil 15, camera, mirror, illumination elements, etc., are arranged and organized in their combined effect so that the mass centre of gravity of the rotary beam 4 lies close to the vertical axis 9.

Details concerning the organization of an air bearing charged with vacuum can be taken from the European patent specification EP 317 787.

The Wire Bonder in accordance with the invention demonstrates the following advantages:

More compact construction.

The load on the bearing element 8 on acceleration of the slide 3 by the linear motor 12 is very low in comparison with the load on the bearing of the Wire Bonder revealed in EP 317 787. Because the drive force is directed fully or at least almost fully towards or away from the centre of gravity of the bondhead 2, no, or in comparison, considerably less torques occur which load the bearing element 8.

The rotating movement of the rotary beam 4 around the vertical axis 9 can take place with very high acceleration as the mass to be accelerated is comparatively low. With the embodiment presented, the linear motor 13 must produce a force to drive the rotary beam 4 which is less than that of the liner motor 12 driving the slide 3 by the factor of 10 and is correspondingly smaller and cheaper. Also the energy source supplying the linear motor 13 can therefore be simpler. All in all, appreciably higher accelerations of the bondhead 2 are possible in the horizontal plane than with prior art.

As a result, the reduced load on the bearing leads to clearly reduced oscillating tendency of the bondhead 2 and to a faster subsiding of any possible oscillations. The bonding process is therefore faster.

The weightless air bearings themselves contribute towards a reduction of the masses to be accelerated.

The direct bearing of the rotary beam 4 on the glide plate 1 offers the advantage that any vertical oscillations of the slide 3 are not transmitted to the bondhead 2.

The position of the capillary is clearly determined by specifying the y coordinate of the vertical axis 9 which is moved together with the slide 3 in y direction and the angle $\theta$ of the rotary beam 4 which designates the rotational position of the rotary beam 4 in relation to the y direction. Conversion of the position of the capillary in Cartesian coordinates ($q_1$, $q_2$) into the position of the capillary in the coordinates (y, $\theta$) takes place, as can be seen in FIG. 2, according to the equations:

$$q_1 = y + R^* \cos,$$

$$q_2 R^* \sin \theta$$

whereby the variable R denotes the distance from the tip of the capillary to the vertical axis 9.

Two position measuring systems are foreseen for determining the coordinates (y, $\theta$) each of which, in the generally known way, comprises a metal rule and a corresponding reading head. The metal rule for measuring the angle $\theta$ is adhered to one of the areas concentric to the upper cylinder 16. When moving to another position, the actual position can be taken into consideration for regulating the currents which flow through the liner motors 12 and 13.

Instead of the glide plate 1 and the bearing element 8, a conventional bearing can be foreseen for guiding the slide 3 in y direction, eg, a table movable in y direction. The rotary beam 4 could also bear on the slide 3 by means of a ball bearing or a solid joint.

FIG. 3 shows an embodiment of the Wire Bonder with which the drive for the turning movement of the rotary beam 4 is arranged rigidly. A linear motor 21 is foreseen for the drive, the stator of which is mounted stationary while the coil is secured to the rotary beam 4.

What is claimed is:

1. Wire Bonder comprising:
   a bondhead with a slide and a rotary beam moved with the slide and rotatable on a vertical axis;
   a rigidly arranged bearing element for guiding the slide along a predetermined horizontal direction so that the slide can only be moved back and forth in this horizontal direction; and
   a drive for moving the slide back and forth in this horizontal direction.

2. Wire Bonder according to claim 1, wherein the slide bears on a horizontally arranged glide plate by means of an air bearing charged with vacuum.

3. Wire Bonder according to claim 2, wherein the rotary beam bears on the horizontally arranged glide plate by means of a further air bearing charged with vacuum.

4. Wire Bonder according to claim 1, wherein the slide comprises two bearings separated by a distance for bearing of the rotary beam.

5. Wire Bonder according to claim 2, wherein the slide comprises two bearings separated by a distance for bearing of the rotary beam.

6. Wire Bonder according to claim 3, wherein the slide comprises two bearings separated by a distance for bearing of the rotary beam.

7. Wire Bonder according to claim 1, further including a drive arranged on the slide for the rotational movement of the rotary beam.

8. Wire bonder according to claim 2, further including a drive arranged on the slide for the rotational movement of the rotary beam.

9. Wire Bonder according to claim 3, further including a drive arranged on the slide for the rotational movement of the rotary beam.

10. Wire Bonder according to claim 4, further including a drive arranged on the slide for the rotational movement of the rotary beam.

11. Wire Bonder according to claim 5, further including a drive arranged on the slide for the rotational movement of the rotary beam.

12. Wire Bonder according to claim 6, further including a drive arranged on the slide for the rotational movement of the rotary beam.

13. Wire Bonder according to claim 1, wherein the rotary beam bears on the slide with air for rotation on the vertical axis.

14. Wire Bonder according to claim 2, wherein the rotary beam bears on the slide with air for rotation on the vertical axis.

15. Wire Bonder according to claim 3, wherein the rotary beam bears on the slide with air for rotation on the vertical axis.

16. Wire Bonder according to claim 4, wherein the rotary beam bears on the slide with air for rotation on the vertical axis.

17. Wire Bonder according to claim 5, wherein the rotary beam bears on the slide with air for rotation on the vertical axis.

18. Wire Bonder according to claim 1, further including a rocker on the rotary beam, the rocker being rotatable on a horizontal axis.

19. Wire Bonder according to claim 2, further including a rocker on the rotary beam, the rocker being rotatable on a horizontal axis.

20. Wire Bonder according to claim 3, further including a rocker on the rotary beam, the rocker being rotatable on a horizontal axis.

21. Wire Bonder according to claim 7, further including a rocker on the rotary beam, the rocker being rotatable on a horizontal axis.

22. Wire Bonder according to claim 1, further including a rocker on the rotary beam, the rocker being rotatable on a horizontal axis, and wherein on the rocker, a horn is secured to which ultrasonics can be applied at the tip of which a capillary is secured which guides the wire.

* * * * *